United States Patent
Barbara et al.

(10) Patent No.: US 6,359,437 B1
(45) Date of Patent: Mar. 19, 2002

(54) RF COILS FOR MAGIC ANGLE SPINNING PROBES

(75) Inventors: Thomas M. Barbara, Mountain View; Knut G. Mehr, San Francisco; Matthew H. Commens, Morgan Hill, all of CA (US)

(73) Assignee: Varian, Inc., Palo Alto, CA (US)

( * ) Notice: Subject to any disclaimer, the term of this patent is extended or adjusted under 35 U.S.C. 154(b) by 0 days.

(21) Appl. No.: 09/545,299

(22) Filed: Apr. 7, 2000

(51) Int. Cl.⁷ .................................................. G01U 3/00
(52) U.S. Cl. ...................... 324/318; 324/322; 324/307
(58) Field of Search .............................. 324/321, 318, 324/322, 307

(56) References Cited

U.S. PATENT DOCUMENTS 6,118,274 A  *  9/2000  Roffmann et al. ........... 324/321

OTHER PUBLICATIONS

Article by Sun and Maciel entitled "The Tilted Coil for NMR Experiments", published in the *Journal of Magnetic Resonance*, Series A 105, pp. 145–150 in 1993.

Article by R. Turner entitled "A Target Field Approach to Optimal Coil Design", published in the *J. Phys. D: Appl. Phys.*, 19, pages L145–L151 in 1986.

Article by Barbara and Bronnimann entitled "Target Field Design for Magic Angle Gradient Coils", published in the *Journal of Magnetic Resonance*, 140, pages 285–288 in 1999.

Article by Hoult and Richards entitled "The Signal–to–Noise Ration of the Nuclear Magnetic Resonance Experiment", published in the *Journal of Magnetic Resonance*, 24, pp. 71–85 in 1976.

* cited by examiner

Primary Examiner—Hezron Williams
Assistant Examiner—Dixomara Vargas
(74) Attorney, Agent, or Firm—Edward H. Berkowitz (57) ABSTRACT

A magnetic field generated by windings supported by a cylindrical former having axis Z is established in a desired direction forming an angle Φ with respect to Z. Over an interval on Z, substantially constant value for the desired field and substantially vanishing orthogonal components are achieved by specifying the current distribution on the cylinder as a solution to field equations and then approximating said current distribution in a discrete conductor forming a plurality of anharmonic loops, nonlinearly spaced in accord with said solution.

5 Claims, 13 Drawing Sheets

RF COILS FOR MAGIC ANGLE SPINNING PROBES

FIELD OF THE INVENTION

The invention is in the field of nuclear magnetic resonance (NMR) and more particularly relates to NMR probes capable of generating an RF magnetic field along the axis of a sample oriented at a selected angle with respect to a polarizing field.

BACKGROUND OF THE INVENTION

It is a standard procedure of analysis by magnetic resonance to rotate a sample at a high rate in a uniform magnetic field to obtain an improved average homogeneous sample volume. It is also characteristic of certain specific experiments to orient the rotational axis at a selected angle with respect to the polarizing ($B_0$) field. The selected angle is most frequently the angle corresponding to the zero of the function $3\cos^2\theta - 1$. This angular dependence is found in the chemical shift anisotropy and the dipolar coupling of nuclei. This angle, corresponding to 54° 44", (the "magic angle") greatly simplifies NMR spectra of solids.

Figure 1:
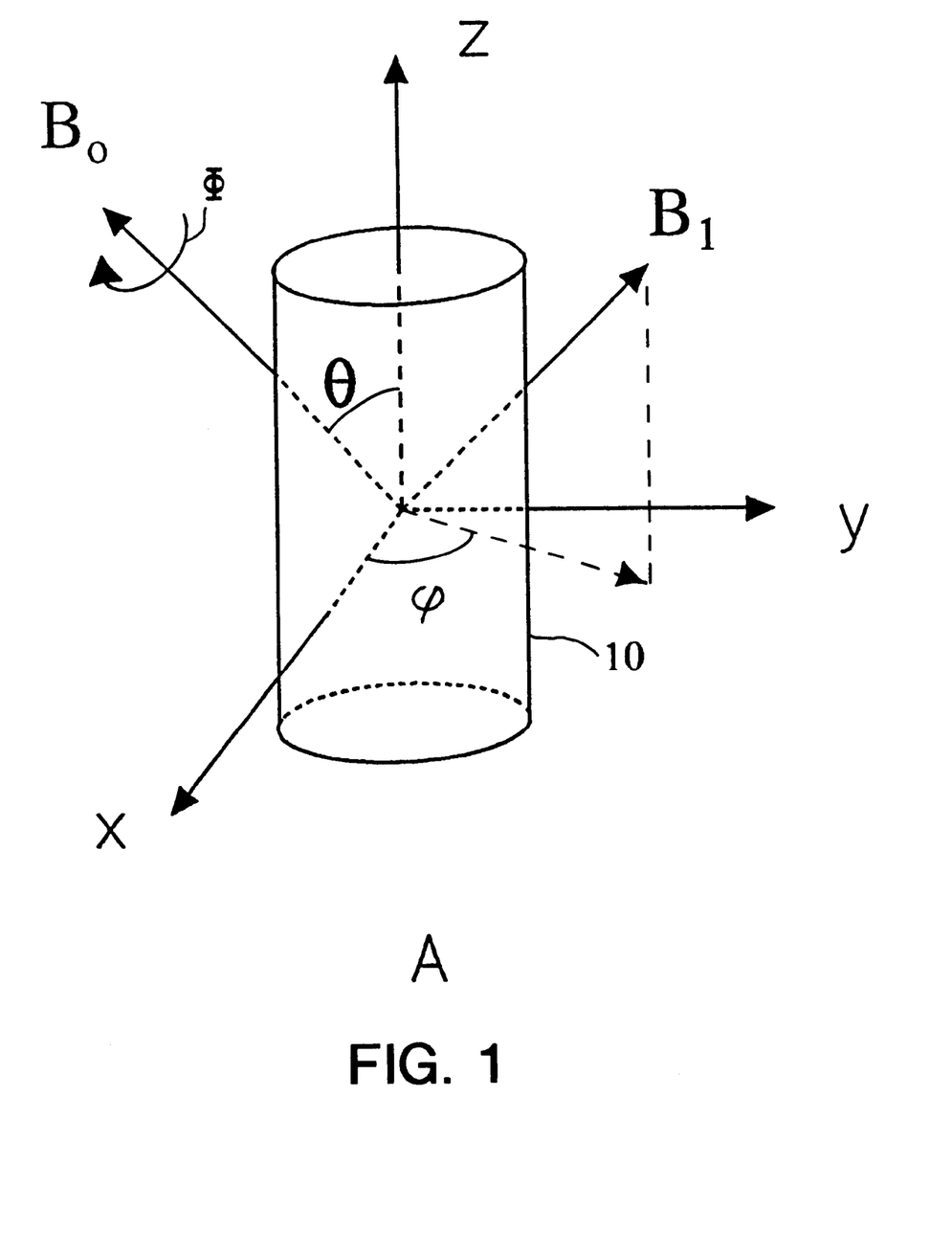
FIG. 1 shows the geometry of a magic angle spinning measurement.

In order to achieve the desired RF magnetic field ($B_1$) distribution over the volume of the sample, an appropriate RF current distribution is to be prescribed in the neighborhood of the sample. The practical implementation is a surface current distribution defined on the surface of a cylinder 10 containing the sample with cylindrical axis at the desired (magic) angle. This cylinder 10 represents a former on which conductors are situated and within which the sample is contained. FIG. 1 is an explanation of the geometry of the present apparatus in the context of an NMR magic angle spinning experiment. It will be apparent that the invention is not restricted to the NMR context. The field $B_0$ is, in the NMR context, the polarizing field. It should be regarded as defining a particular direction in space. A coordinate system based upon a selected axis Z is at some angle from $B_0$. In the NMR context Z is a rotational axis for sample spinning and it is, in practical arrangements, the axis of a cylindrical former 10 upon which coil windings 11, 12 are supported. The windings 11, 12 must generate a magnetic field $B_1$ in a direction orthogonal to $B_0$. Consider $B_0$ as the normal to a plane containing $B_1$.

Figure 2:
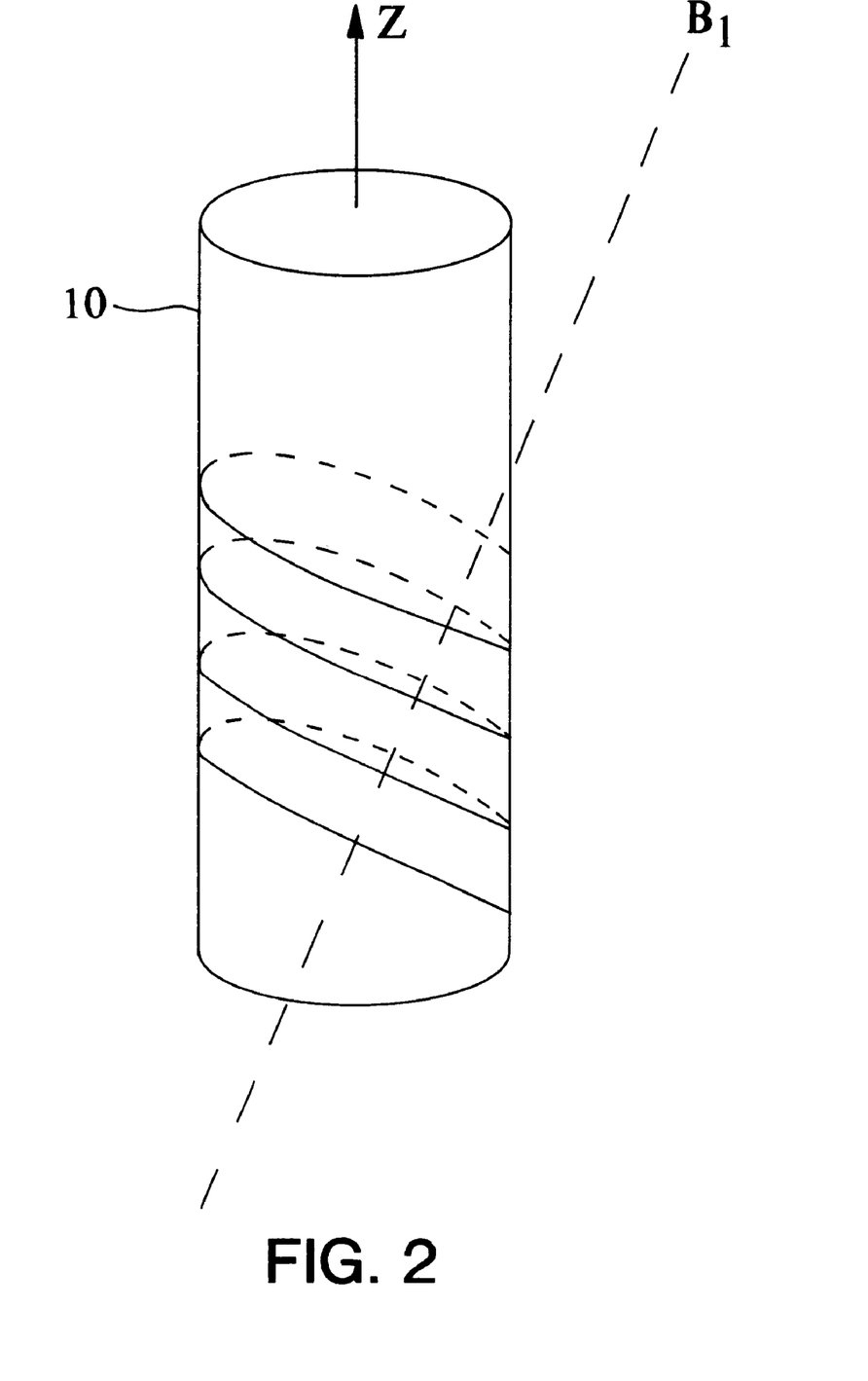
FIG. 2 shows the prior art RF coil for MAS applications.

The prior art sought to realize the desired $B_1$ field strength in the geometry of FIG. 1 with a solenoidal coil, coaxially wound about the coil former on the desired spinning axis, with coil loops tilted to define planes (approximately) which form an angle ψ with respect to the spinning axis, where ψ is the complement (≈35°) of the magic angle (54.7°). The prior art idealized this arrangement for computational purposes as an approximation to a set of current loops, each lying in a plane defining a normal at the desired angle, the several planes aligned along the z axis of revolution. FIG. 2 shows the tilted current loops of the prior art in the context of a typical magic angle experimental arrangement. This prior art is reported by Sun and Maciel, J. Mag. Res. A105, pp. 145–150 (1993).

For a standard solenoid the magnetic field distribution is found from the Biot-Savart equation as induced by a number of circular current loops aligned on the z axis and producing a magnetic field which is aligned along the z axis. A real solenoid has some finite pitch, finite length and discrete windings with finite dimensions and substantial spacing, with resulting non-zero field components other than the axial component. Apart from these minor effects, the prior art exhibits further departures from an axial field as an inherency of the prior art approach. Consider that a (closely wound) cylindrical solenoid may be regarded as a number of circular current loops. The tilting of a current loop prescribes a plane intersecting the cylinder at the tilt angle and thereby defining an ellipse of corresponding eccentricity. The result of an elliptical current loop is to generate radial and azimuthal magnetic field components in addition to the axial component. Thus, the efficiency of the coil, as determined by the energy required to produce a desired $B_1$ amplitude and distribution and to sustain that $B_1$ over a desired pulse width, will require significantly more RF power than would be the case if these non-axial components could be reduced or eliminated.

SUMMARY OF THE INVENTION

In order to obtain a magnetic field substantially confined to a desired acute orientation with respect to the axis of a cylinder of revolution on which suitable windings are disposed, that field is prescribed and solutions are obtained for a surface current distribution on that surface of revolution which yields the desired magnetic field over the axial extent of the windings. The resulting contour function is then approximated by a discrete distribution of the integrated current density that yields the desired oriented field with substantially vanishing components orthogonal to the desired direction. In one embodiment the contours are broken and adjacent contours joined to produce a serial assembly of current loops that generate the desired field. In another embodiment a parallel assembly of current loops is obtained.

BRIEF DESCRIPTION OF THE FIGURES

FIG. 4 shows axial dependent RF magnetic field profiles along the desired direction and the normal component thereto for the prior art coil of FIG. 3a.

FIG. 6c shows the axial dependence of the magnetic field derived from the contours of FIG. 6a.

DETAILED DESCRIPTION OF THE INVENTION

As described above, the prior art approach is motivated by the geometrical basis of the MAS experiment. In order to project a greater component of $B_1$ along the desired orientation, $\pi/2-\theta$, the prior art taught that the current loops be oriented (tilted) so that the planes of the current loops approximately define a normal in the desired $B_1$ direction.

The present invention begins from a different perspective. The desired $B_1$ amplitude and distribution is taken as the starting point from which it is desired to compute that surface current distribution on a given surface which will result in the desired $B_1$ field. This technique is known as the target field method and was early described by Turner, J. Phys. D: Appl. Phys. V. 19, L147–L151 (1986) and recently extended to the case of cylinders as coil formers for an arbitrary angle, by Barbara and Bronnimann, J. Mag. Res., V. 140, pp. 285–288 (1999). For prescribing a magnetic field distribution within a cylindrical volume of specified radius, a continuous current distribution flowing on the cylinder surface may be determined analytically. The continuous current distribution is then approximated by a set of discrete currents from which a real coil is specified. These calculations were carried out with the software package, Mathcad (version 6), (Mathsoft, 1995).

The $B_0$ field and coil axis lie in the x-y plane with the z axis along the coil former and the direction of $B_0$ is given by the vector $(0, -\sin\theta, \cos\theta)$. For the RF magnetic field $B_1$ to maintain orthogonality with $B_0$ we have in cartesian coordinates $$B_1 = A\cos\phi(\cos\theta e_y + \sin\theta e_z) + B\sin\phi e_x$$

The angle $\Phi$ parameterizes a family of directions that are perpendicular to $B_0$ with $\Phi=\pi/2$ corresponding to the case of a saddle coil, and $\Phi=0$, a tilted coil structure. By converting to cylindrical coordinates $(\rho,\phi,z)$ and applying the methods of outlined in the Barbara et al reference, acceptable target fields are of the form, $$B_z = A\sin\theta \rho F(z)$$

$$B_z^{(-1)} = i\rho/2(A\cos\theta\cos\Phi - iB\sin\Phi)d/dz(F(z))$$

$$B_z^{(1)} = (B_z^{(-1)})^* \qquad \text{Equ. 1}$$

where F(z) denotes a truncation function. The purpose of this function is to limit the homogeneous region of the RF field and specify the manner in which it goes to zero outside that region. Typical choices for F(z) might be $$F(z) = [1+(z/d)^{2m}]^{-1}$$

where m is an integer, or $$F(z) = [1+eT_n^2(z/d)]^{-1}$$

where the parameter d defines the length over which the magnetic field is reasonably uniform. For the latter function e specifies an error condition and $T_n$ denotes a Chebychev polynomial. These choices are only representative.

As usual, the superscripts are used to specify the order in the harmonic expansion of the magnetic field. Eq[2]. can now be used to solve for the current densities $J^{(m)}$. After transformation to reciprocal space through the Fourier Transform integral, the azimuthal current densities are derived from the formula $$J_\phi^m(k) = e^{-\alpha k^2 k} B_z^{(m)}(c,k)/\mu_0 k I_m(k,c) K'_m(ka) \qquad \text{Equ. 2}$$

where c is the target radius, a is the current former radius and I and K are Bessel functions. The Gaussian apodization, specified by the parameter $\alpha$, is used to assure a finite current density at large wavenumbers (k approaching infinity). The necessity of apodization results from choosing a form for F(z) that does not have physically realizable behaviour for large k, but nonetheless, possesses the desired shape for small values of k. As some amount of apodization is often required to ensure finite current densities, the derived currents will not reproduce the target field profile exactly. It is useful then to have formulas that connect all the components of the magnetic field to these currents. For each harmonic m, the magnetic field in k space is $$B_z^{(m)}(k) = -\mu_0 akd_m J\Phi^m(k)$$

$$B_y^{(m)}(k) = -\frac{1}{2}\pi[\mu_0 ak/2(D_{m+1}J_\Phi^{m+1}(k) - D_{m-1}J_{101}^{m-1}(k)]$$

$$B_x^{(m)}(k) = -i/2\pi[\mu_0 ak/2(D_{m+1}J_\Phi^{m+1}(k) - D_{m-1}J_\Phi^{m-1}(k)] \qquad \text{Equ. 3}$$

where $D_{m\pm n}$ is used as short hand for the Bessel function combination $I_m(k) K'_{m\pm n}(ka)$ and $\alpha$ is the coil cylinder radius.

What has been obtained by the above calculations is the current density distribution for realizing the desired magnetic field distribution. Actual coils can be constructed by integrating the current densities along the cylinder length $$S_m(z) = -\infty \int^z dz J_\Phi^m(z) \qquad \text{Equ. 4}$$

and combining for the total current $$S_t(\Phi z) = Re(S_0(z) + S_1(z)e^{i\Phi} + S_{-1}(z)e^{i\Phi}) \qquad \text{Equ. 5}$$

The resulting surface of total current can then be approximated with a wire pattern by placing wires along the contours of $S_t$.

In passing from the continuous current density distribution to a discrete current pattern, the scaling of the current to practical values is a matter of design. In like manner, the number N of current loops (the contour interval over the range from 0 to maximum value) represents a better approximation to the shape of the current density distribution as N becomes large. Practical considerations usually result in N a small number and the results here demonstrate the unusually good results for the axial dependence of the target field where N is small. It is also a matter of choice whether the discrete approximation be realized as a parallel or a series arrangement of the contour/current loops resulting from the discrete expression of the current density distribution. A serial circuit arrangement of the contours/loops is preferred as a practical matter and this insures a single value for the current although this need not be regarded as a requirement of the present invention.

Figure 4:
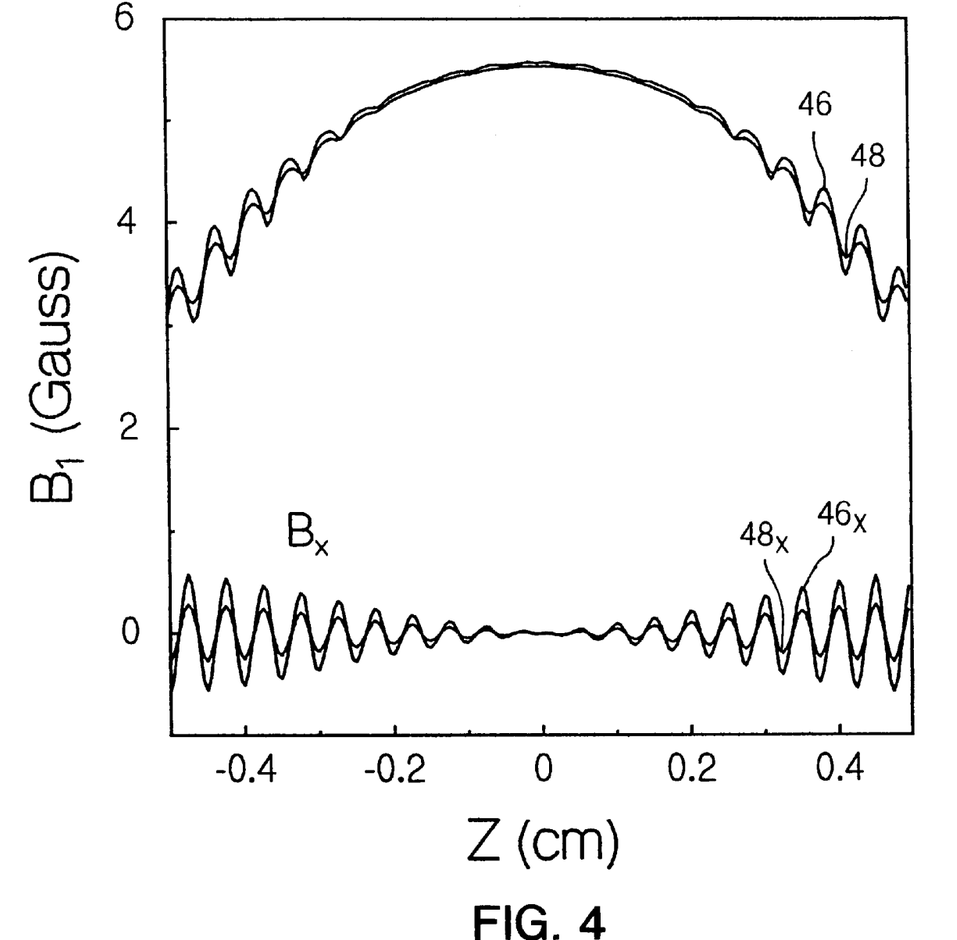
Figure 5:
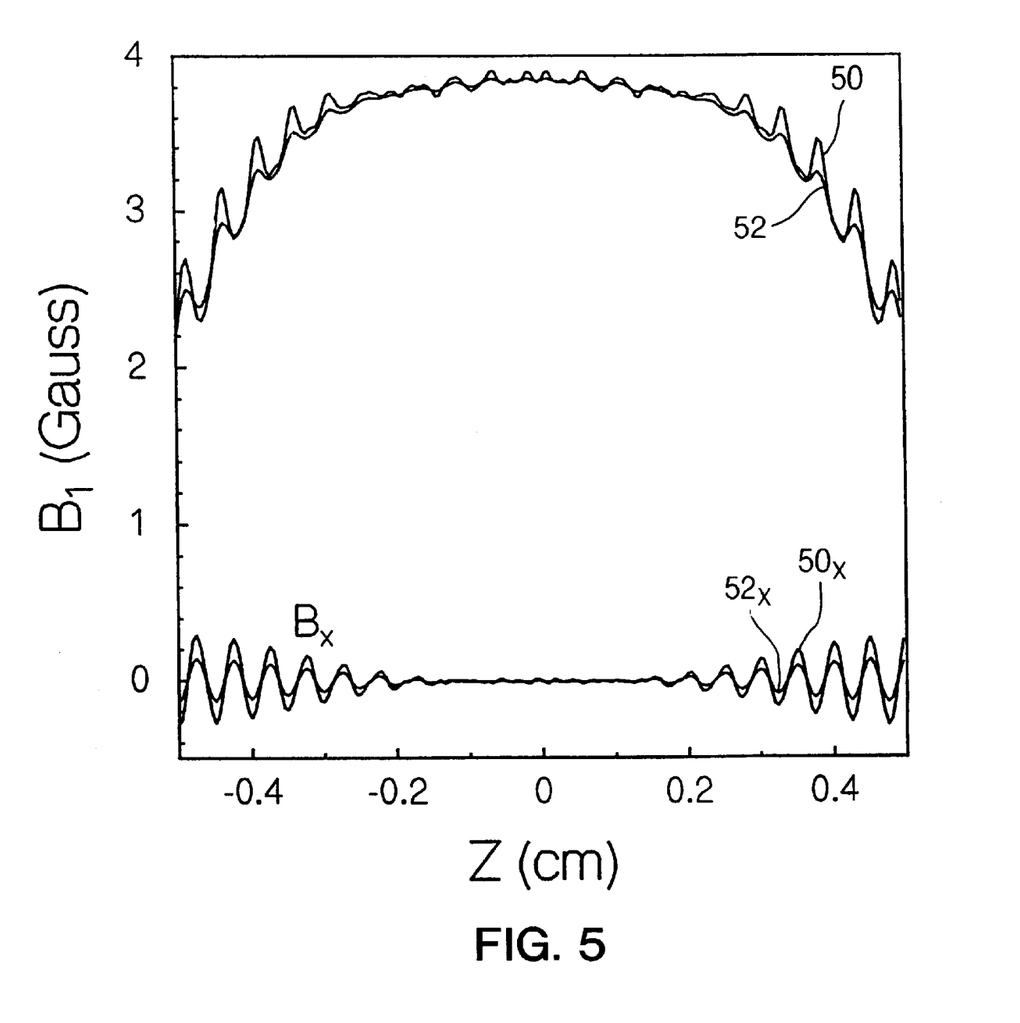
FIG. 5 shows axial dependent RF magnetic field profiles along the desired direction and the normal component thereto for the current density distribution of FIG. 3b.

A comparison of the prior art of Sun and Maciel with the present invention is obtained by specifying a prior art cylindrical former of given diameter and discrete current value identical with values specified for an example of the present invention. The prior art windings are uniformly spaced over the same axial interval as for the present invention. The cylinder diameter is taken as 0.3 cm and the current is 1 amp. The prior art current loops are tilted at an angle of 35° to produce the field at the desired direction. The same direction is specified for the present invention. The computed axial dependence of the magnetic field component along this desired direction and an orthogonal component thereto ($B_x$) is shown for the prior art at FIG. 4. Two cylindrical radii, 0.05 (curve 48) and 0.1 cm (curve 46), are shown to exhibit the radial dependence of the field. Corresponding to curves 46 and 48 are the orthogonal components 46x and 48x. FIG. 5 is the corresponding data for 46 and 48 for respective cylindrical radii including the orthogonal components 46x and 48x for the present invention. It is apparent that the present invention provides a relatively uniform value for the $B_1$ component along this direction with a substantially vanishing orthogonal component, as compared with the prior art.

Figure 3A:
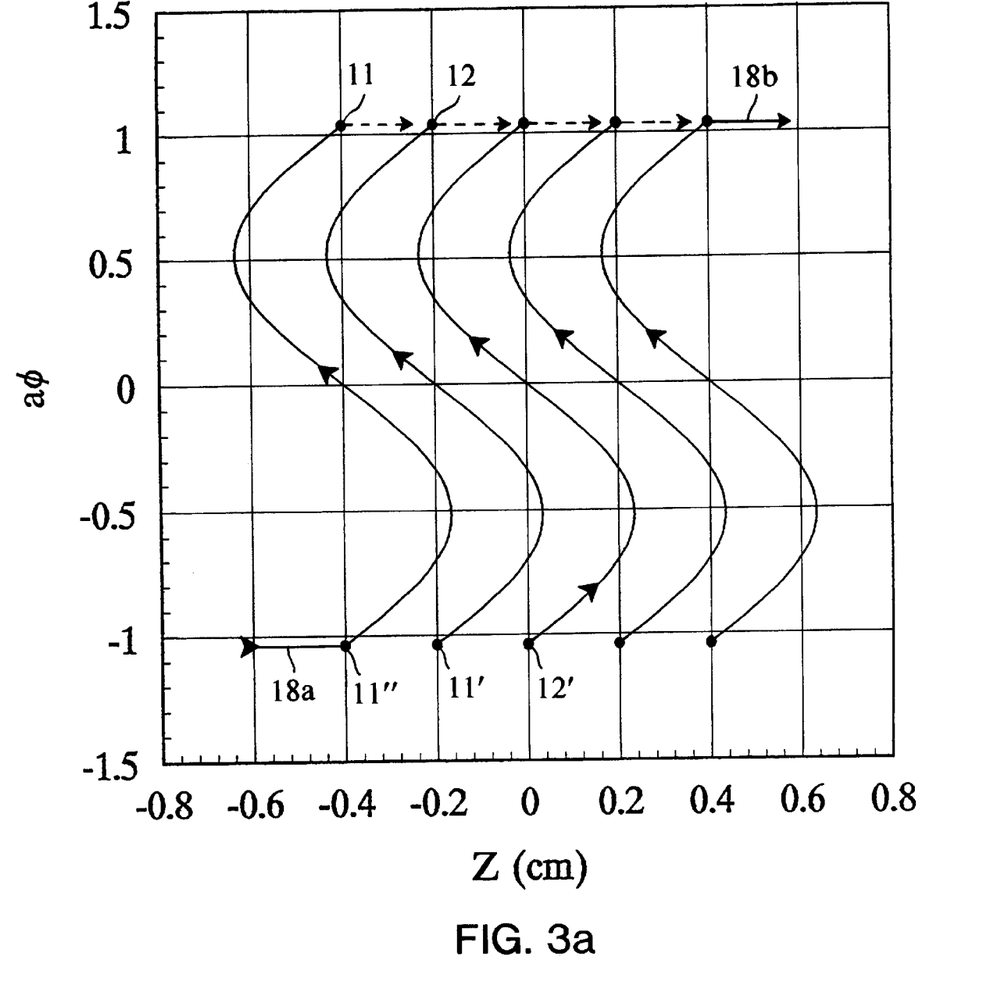
FIG. 3a shows the prior art for $B_1$ directed at the magic angle, as mapped onto a plane.
Figure 3B:
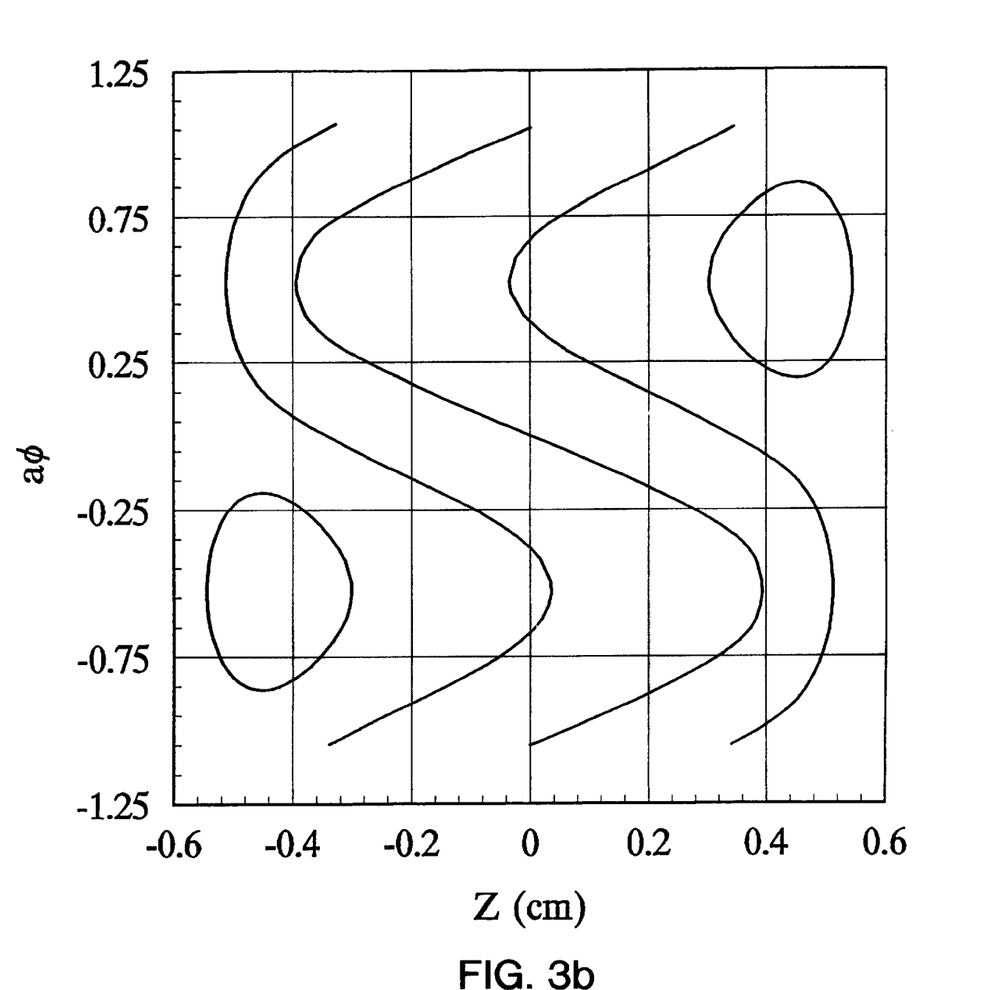
FIG. 3b shows the computed current density distribution per the invention, for $B_1$ directed at the magic angle, as mapped onto a plane for $\Phi=0$.

FIGS. 3a and 3b may be compared directly to demonstrate the difference in the prior art and the invention. These figures are each a mapping from the cylindrical case to a plane. In order to model the prior art as set forth in the Sun and Maciel reference, the prior art comprises a number of planar current loops aligned along a common axis with the several loop planes tilted (at the complement of the magic angle). In order to produce an approximation for this arrangement, the electrical realization is indicated at FIG. 3a where the point 11 is electrically identical to the point 11', the point 12 is electrically identical to 12', etc. Thus, 11' and 11" are not the same geometric point but instead represent a break in a loop tilted with respect to the z axis. The direction of current flow is indicated from 18a to 18b. These projections onto the plane form harmonic curves as expected from the intersection of a plane with a quadradic surface with closed curves (here, ellipses) resulting. In contrast with this representation, the present invention results in an anharmonic shape for the current distribution as compared with the obviously harmonic distribution of the prior art. The conductors are nonlinearly spaced. The closed contours 20, 20' that appear in FIG. 3b are not essential features, but merely emphasize the variety of form that may result from the mathematical relationship underlying the physical relationship of electrical current and the specified geometry. In contrast, the prior art is based upon a geometric model that imposes the harmonic form on the prior art current distribution. The closed contours 20 and 20' suggest singularities in the mathematical representation of the desired field. Whether such singularities appear in the region of interest (within the limits of a given dimensioned substrate) are a manifestation of the physical specifications and scaling of the currents and dimensions.

Figure 3C:
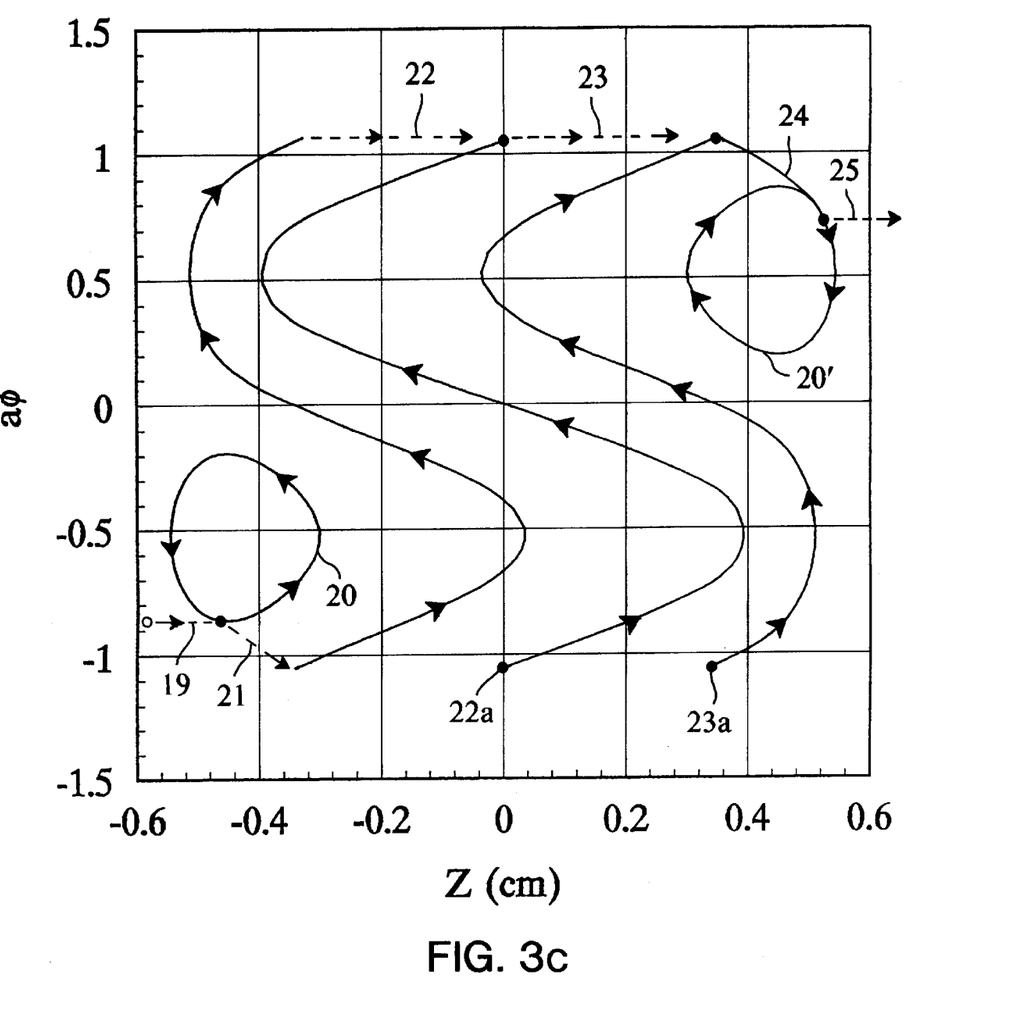
FIG. 3c is a discrete series current realization of the function of FIG. 3b.
Figure 3D:
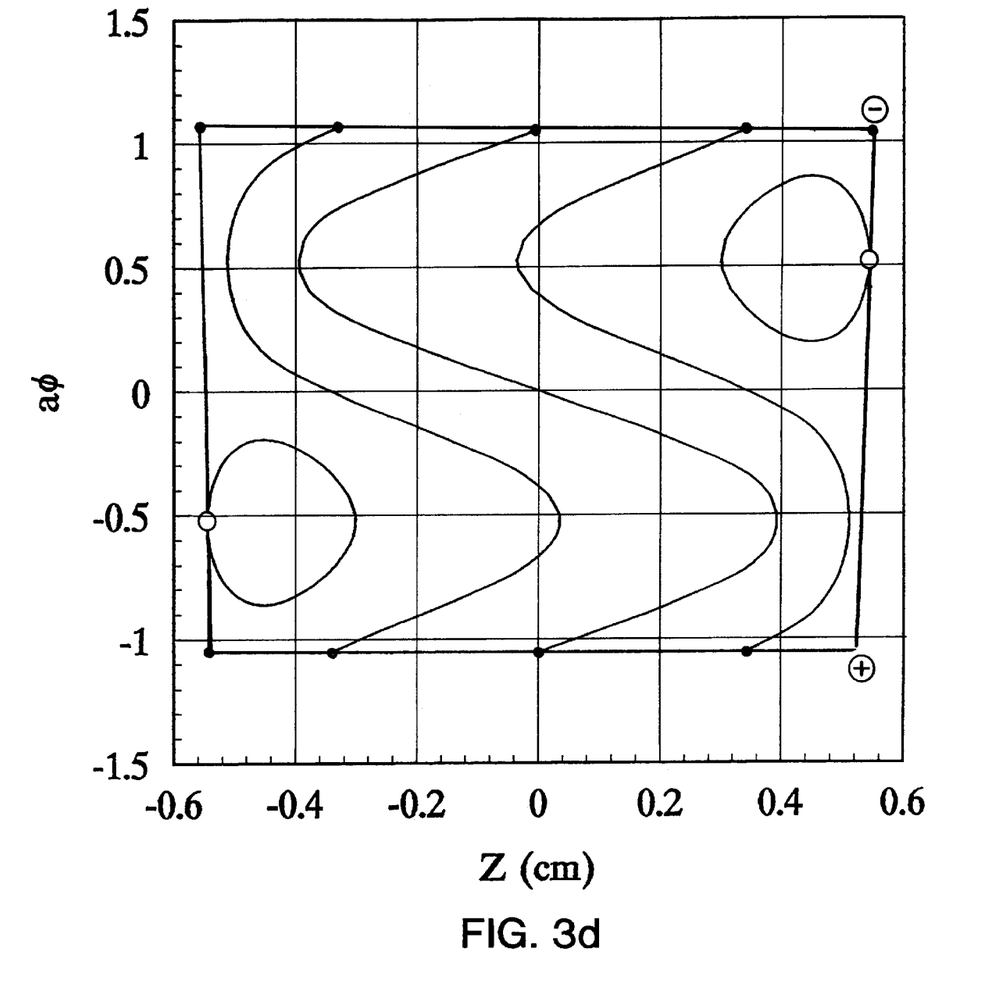
FIG. 3d is a discrete parallel current realization of the function of FIG. 3b.

FIG. 3c is an example of the passage from the computed continuous function $J_\Phi(z)$ of FIG. 3b to a corresponding discrete current pattern for realizing the desired magnetic field in the preferred manner from a series arrangement of loops derived from the computed contours. The serialization of a set of contours (to form a conductor carrying the same current) does not have a unique specification. The serialization shown is one choice. Thus, contour 20 is broken and forms a loop at the point where lead 19 comprises one end of the loop and lead 21 represents the other end. In like manner dotted line 22 represents the connection to point 22a and dotted line 23 represents the connection to point 23a. A conductor segment 24 forms one lead to the loop formed from breaking contour 20' and lead 25 is the other end of that loop. FIG. 3d represents the realization of the coil for the case where the several contours are treated as parallel loops carrying the currents of the same value. The present invention is not limited to the constraint of a single value of current, but this is presently preferred for computational ease and the simplicity in practical realization.

As observed above, the case of $\Phi=\pi/2$ corresponds to the geometry of a saddle coil. In general use saddle coils have previously been designed and fabricated from geometrical considerations. The design considerations for saddle coils has been summarized by Hoult and Richards, J. Mag. Res., V. 24, pp. 71–85, (1976), where a power series expansion was used to indicate wire placements such that undesirable magnetic field characteristics could be minimized or eliminated. Thus, a saddle coil, according to this prior art, should be wound to include a window angle subtending 120° in order to reduce off-axis inhomogeneity. Axial homogeneity is then optimized by choosing a favorable window length to coil former diameter, the prior art urging a ratio of 2. These design constraints are satisfied by one set of wires, or for a number of loops, the windings must individually satisfy these constraints approximately.

Figure 7:
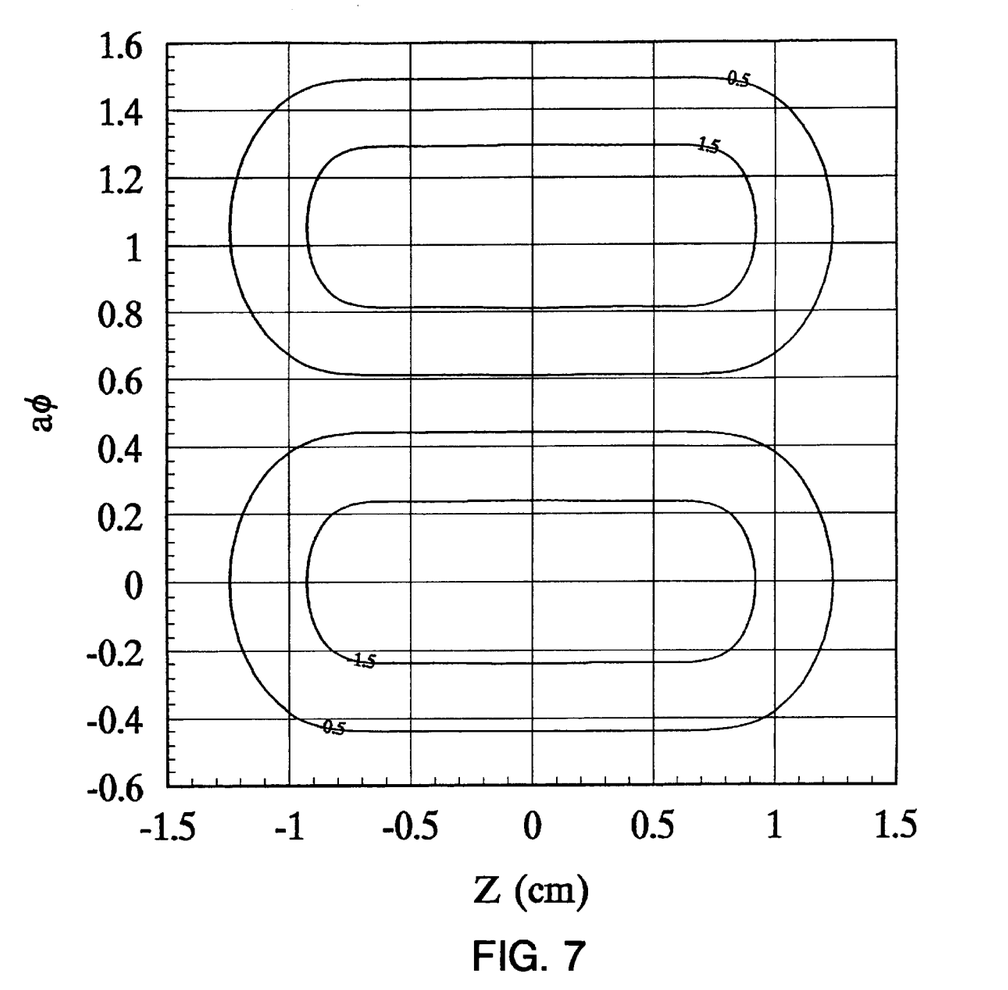
FIG. 7 shows contours for the case where $\Phi=\pi/2$.
Figure 8:
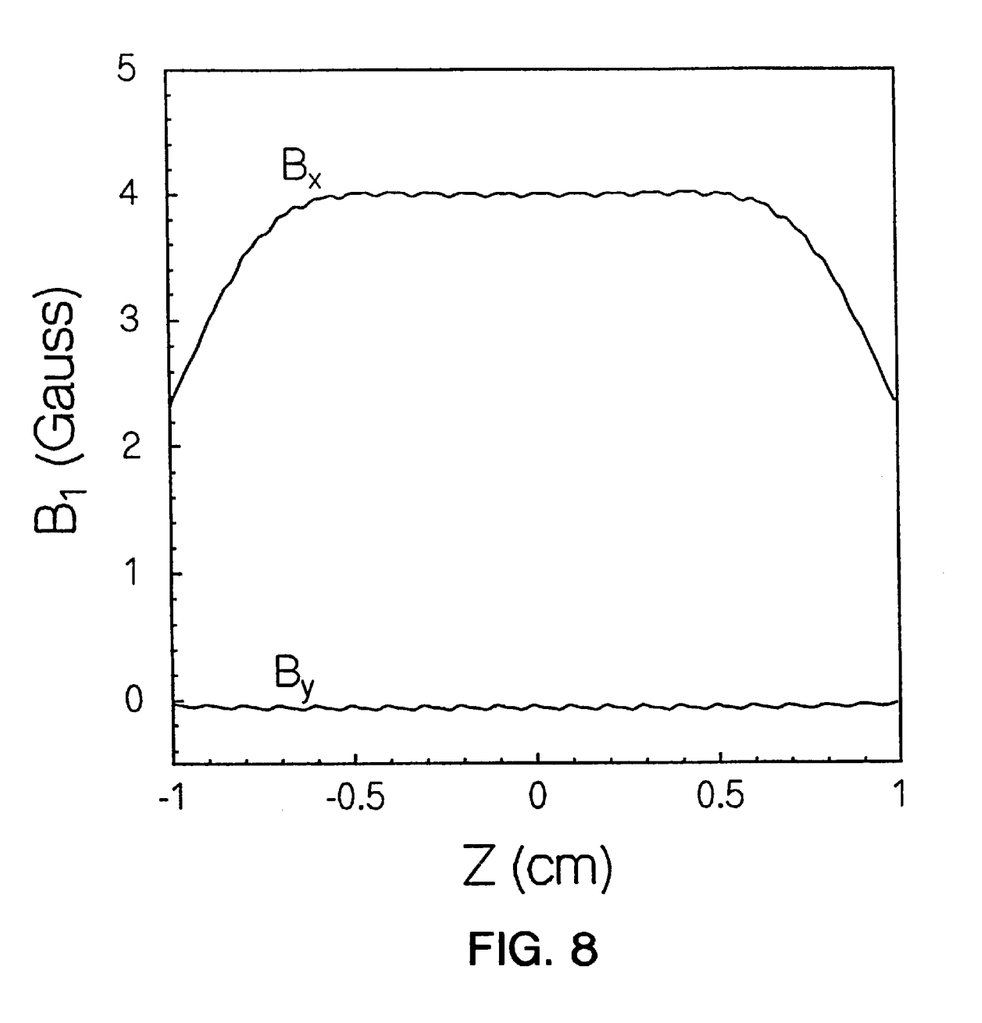
FIG. 8 is the magnetic field profile for a coil realized from the contours of FIG. 7.

Following the present invention, the case $\Phi=\pi/2$ yields contours of current density such as shown in FIG. 7 for a coil formed on a 0.34 cm former to accommodate a sample space of length 1 cm with windows subtending about 100°. The resulting computed magnetic field profile is shown in FIG. 8. The constraints of prior art need not be taken as fundamental design constraints where the present invention is employed.

Figure 6A:
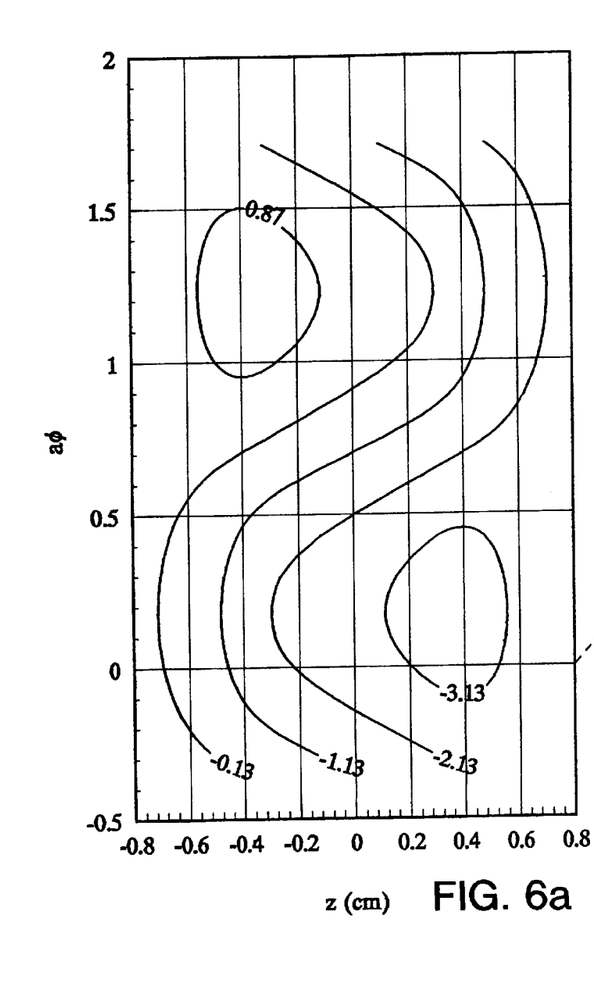
FIG. 6a shows one ($\Phi=\pi/4$) of a pair of current contours for crossed RF coils for double resonance using the present invention.
Figure 6B:
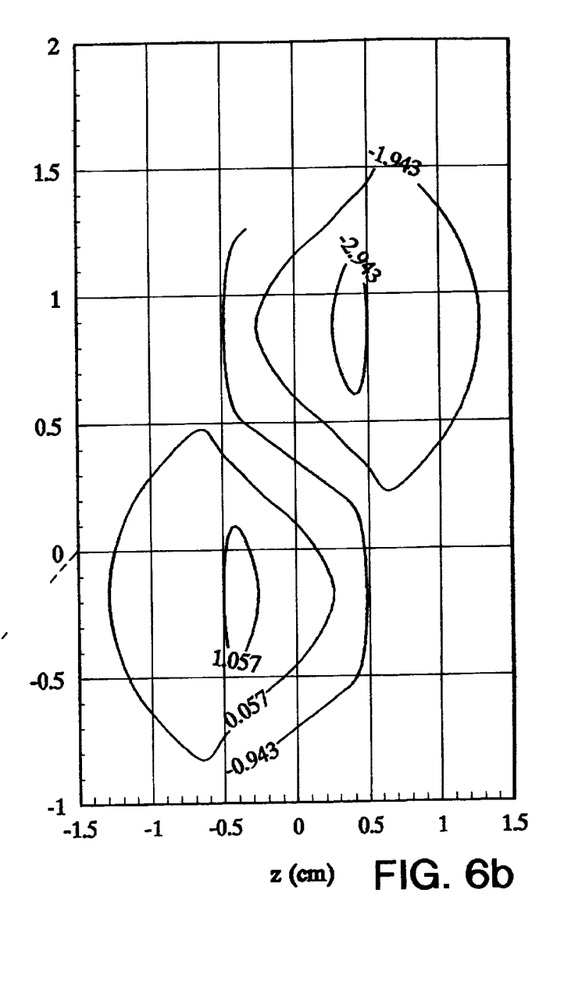
FIG. 6b shows the second ($\Phi=-\pi/4$) of a pair of current contours for crossed RF coils for double resonance using the present invention.
Figure 6C:
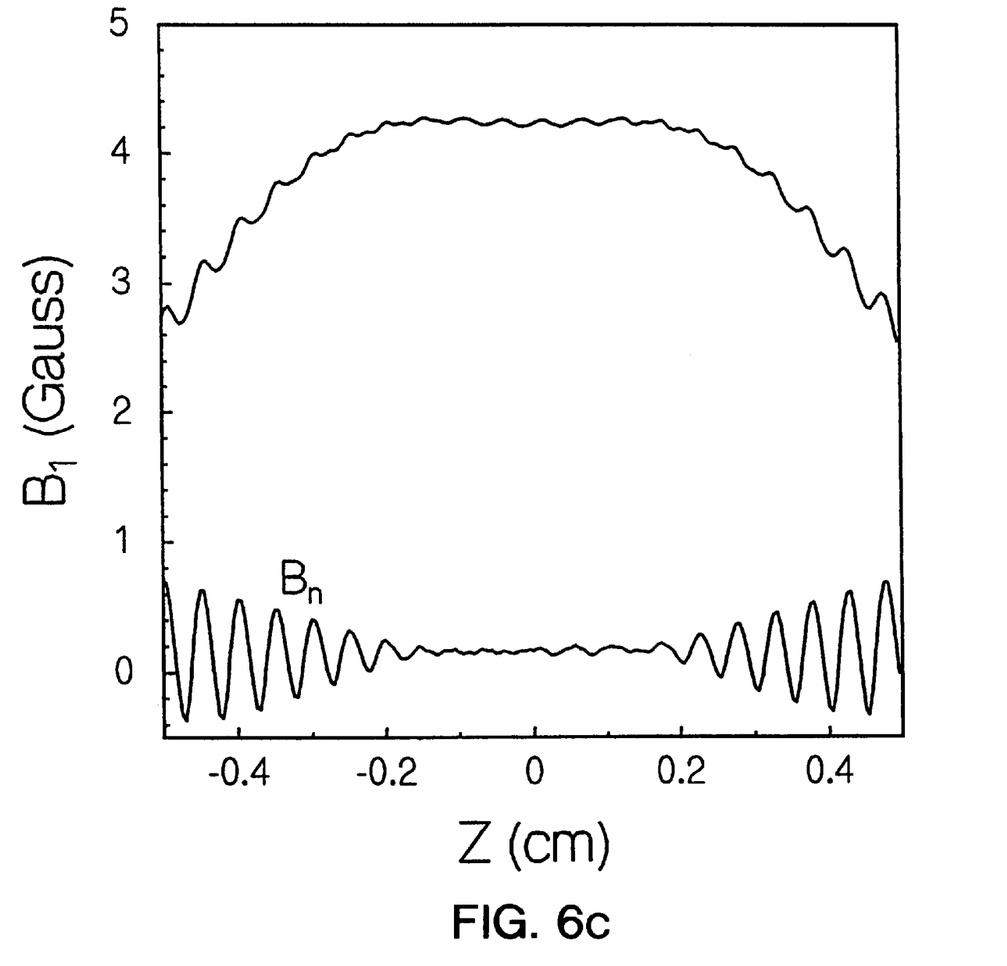
Figure 6D:
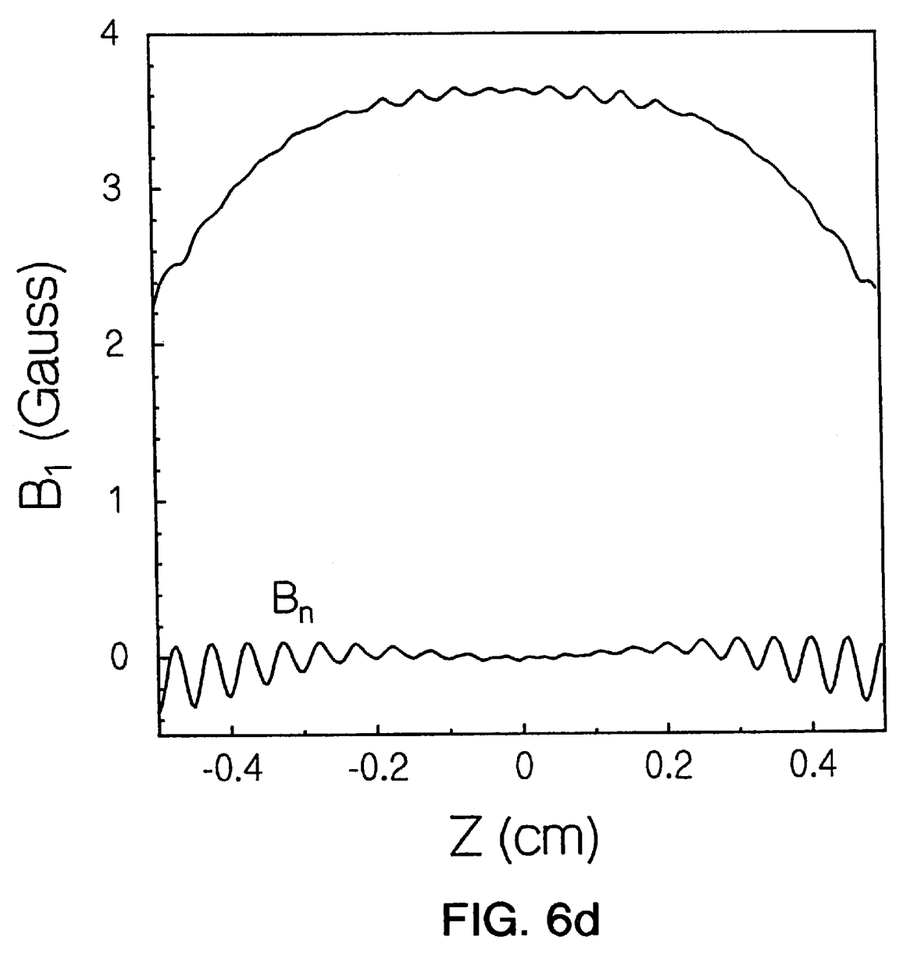
FIG. 6d shows the axial dependence of the magnetic field derived from the contours of FIG. 6b.

As described herein, a particular field direction relative to a cylindrical axis may be specified, along which a magnetic field may be realized without significant orthogonal components, and for which there is essentially no axial dependence over a sample volume. In arrangements discussed above, only one surface of a cylindrical former is assumed to support the current contour resulting in the field at the desired direction. A second independent magnetic field direction may be specified and realized from a second current contour supported on the opposite surface of the cylindrical former. Values of the current density distribution are shown for each contour for the respective desired magnetic field. In the field of NMR, these independent RF magnetic fields may be used for diverse purposes. These coils may be the instrumentalities for double resonance experiments. The coils may be used for specifying pairs of arbitrarily selected field directions appropriate to particular experiments, or to accommodate a quadrature experiment in a rotating frame where the coils establish orthogonal fields. For multi-layered formers, it is apparent that additional independent current contours may be realized for establishing corresponding independent fields. FIG. 6a is a contour for specifying a first RF magnetic field at $+\pi/4$ and FIG. 6b is the contour for $-\pi/4$. These contours differ significantly. However, the resulting magnetic field dependencies are remarkably similar in accord with the invention.

Although this invention has been described with reference to particular embodiments and examples, other modifications and variations will occur to those skilled in the art in view of the above teachings. It should be understood that, within the scope of the appended claims, this invention can be practiced otherwise than as specifically described.

What is claimed is:

1. In a magnetic resonance device for establishing a magnetic field along a desired direction, comprising a cylindrical surface having an axis of rotation Z and radius r, where said desired direction is at an angle $\Phi$ with respect to Z, an electrical conductor supported on said cylindrical surface and forming a plurality of current loops on said surface, said loops disposed anharmonically on said surface and spaced nonlinearly in accord with a mathematical relationship between said magnetic field and a current density distribution approximated by said current loops, wherein magnetic field components orthogonal to said direction are negligibly small over a specified interval on said Z axis.

2. The device of claim 1 wherein said current loops are electrically related in series.

3. The device of claim 1 wherein said current loops are in an electrically parallel relationship.

4. The device of claim 1 wherein said cylindrical surface comprises a surface of a hollow cylindrical former, said former having a second cylindrical surface opposite said cylindrical surface,     second electrical conductor supported on said second cylindrical surface and forming a second plurality of current loops on said second cylindrical surface,     said second plurality of loops disposed anharmonically on said second cylindrical surface and spaced nonlinearly in accord with a mathematical relationship between a second selected magnetic field oriented in a second selected direction and a current density distribution approximated by said second plurality of current loops,     whereby magnetic field components orthogonal to either said desired direction and said second selected direction are negligibly small over a specified interval on said Z axis.

5. An NMR probe comprising at least one coil disposed on a surface of revolution, said coil having a mapping on a plane, said mapping comprising a plurality of current loops, said loops disposed anharmonically and spaced nonlinearly in accord with a mathematical relationship between the current density distribution approximated by said current loops and a preselected magnetic field of desired direction, said direction nonparallel with the axis of said cylinder of revolution.

* * * * *